(12) United States Patent
Lee et al.

(10) Patent No.: US 9,948,105 B2
(45) Date of Patent: Apr. 17, 2018

(54) DATA CONTROL SYSTEM

(71) Applicant: LSIS CO., LTD., Gyeonggi-do (KR)

(72) Inventors: Seung Hun Lee, Gyeonggi-do (KR); Jong Bae Kim, Seoul (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/221,480

(22) Filed: Jul. 27, 2016

(65) Prior Publication Data

US 2017/0033563 A1 Feb. 2, 2017

(30) Foreign Application Priority Data

Jul. 28, 2015 (KR) ........................ 10-2015-0106903

(51) Int. Cl.

| | |
|---|---|
| *H04B 10/40* | (2013.01) |
| *H04B 10/80* | (2013.01) |
| *H04J 3/06* | (2006.01) |
| *H04L 7/00* | (2006.01) |
| *H02J 3/36* | (2006.01) |
| *G01R 19/25* | (2006.01) |
| *H02J 13/00* | (2006.01) |
| *H02M 5/458* | (2006.01) |

(52) U.S. Cl.
CPC ............ *H02J 3/36* (2013.01); *G01R 19/2513* (2013.01); *H02J 13/0086* (2013.01); *H02M 5/4585* (2013.01); *H04B 10/40* (2013.01); *H04B 10/807* (2013.01); *H04J 3/0661* (2013.01); *H04L 7/0075* (2013.01); *H04J 3/0644* (2013.01)

(58) Field of Classification Search
None
See application file for complete search history.

(56) References Cited

U.S. PATENT DOCUMENTS

| | | |
|---|---|---|
| 6,275,554 B1 | 8/2001 | Bouillet et al. |
| 6,590,903 B1 | 7/2003 | Hofers et al. |
| 6,618,648 B1 | 9/2003 | Shirota et al. |
| 7,920,602 B2 | 4/2011 | Park et al. |

(Continued)

FOREIGN PATENT DOCUMENTS

| | | |
|---|---|---|
| EP | 1830447 A1 | 9/2007 |
| JP | 2003273876 A | 9/2003 |

(Continued)

OTHER PUBLICATIONS

Y. Serizawa, M. Myoujin, K. Kitamura, N. Sugaya; Title: Wide-Area Current Differential Backup Protection Employing Broadband Communications and Time Transfer Systems; IEEE Transactions on Power Delivery, vol. 13, No. 4., Oct. 1, 1998, pp. 1046-1052.

(Continued)

*Primary Examiner* — Darren E Wolf
(74) *Attorney, Agent, or Firm* — K&L Gates LLP

(57) ABSTRACT

Disclosed embodiments relate to a data control system. In some embodiments, the data control system includes a transmission module configured to add synchronization signal information to data included in a first data stream to generate a second data stream, and a plurality of control modules configured to receive the second data stream from the transmission module. In some embodiments, the data includes power information.

12 Claims, 7 Drawing Sheets

(56) References Cited

U.S. PATENT DOCUMENTS

| | | |
|---|---|---|
| 8,582,642 B2 | 11/2013 | Kwon et al. |
| 8,675,691 B2 | 3/2014 | Park et al. |
| 2008/0094986 A1 | 4/2008 | Coene |
| 2009/0079267 A1 | 3/2009 | Korba et al. |
| 2010/0111491 A1 | 5/2010 | Kamoto |
| 2010/0150175 A1 | 6/2010 | Bjorklund et al. |
| 2012/0156987 A1* | 6/2012 | Nakayama ............ H04W 56/00 455/13.2 |
| 2013/0166090 A1 | 6/2013 | Ren et al. |

FOREIGN PATENT DOCUMENTS

| | | |
|---|---|---|
| JP | 3718577 B2 | 11/2005 |
| JP | 2011049769 A | 3/2011 |
| JP | 2015-503891 A | 2/2015 |
| KR | 10-0229991 B1 | 11/1999 |
| KR | 100317981 B1 | 12/2001 |
| KR | 10-2003-0031711 A | 4/2003 |
| KR | 10-0580176 B1 | 5/2006 |
| KR | 10-0568435 B1 | 6/2006 |
| KR | 10-2006-0121107 A | 11/2006 |
| KR | 20100059293 A | 6/2010 |
| KR | 1020100059293 A | 6/2010 |
| KR | 10-1537760 B1 | 7/2015 |
| WO | 0117092 A1 | 3/2001 |
| WO | 2008/126465 A1 | 10/2008 |

OTHER PUBLICATIONS

Extended European Search Report for Application No. 16166745.6 dated Dec. 21, 2016, in 8 pages.
Korean Notice of Allowance for App. No. 10-2015-0106903, dated Oct. 5, 2016 in 3 pages.
Korean Office Action dated Jul. 13, 2016 in 144 pages.
Japanese Office Action dated Jul. 31, 2017 in Patent Application No. 2016-138275 in 4 pages.

* cited by examiner

FIG. 6
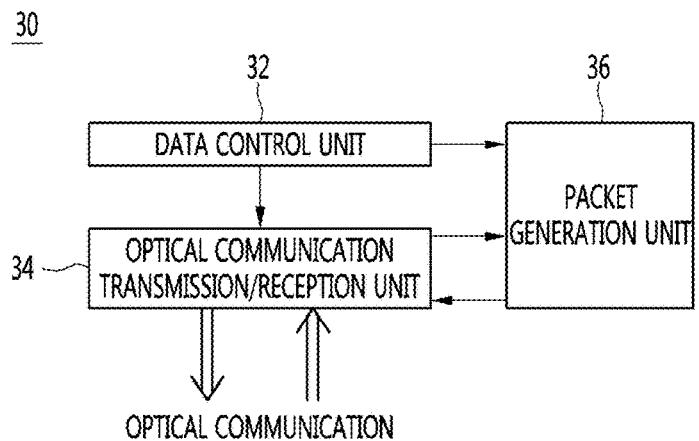
FIG. 7
|  | F E D C B A 9 8 | 7 6 5 4 3 2 1 0 |
|---|---|---|
| Header 1(x00) | Message type | Transmit length |
| Header 2(x01) | Time Slot ID | Sequence NO. |
| Data0 (x03) | DATA[0] ||
| ... | ... ||
| Data(x1E) | DATA[28] ||
| CRC(x1F) | Checksum ||
FIG. 8
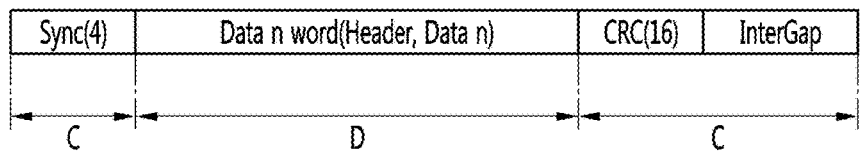

DATA CONTROL SYSTEM

CROSS-REFERENCE TO RELATED APPLICATIONS

The present application claims the benefit of Korean Patent Application No. 10-2015-0106903, filed on Jul. 28, 2015, which is hereby incorporated by reference in its entirety.

BACKGROUND

The present disclosure relates to a data control system and particularly to a data control system capable of improving data reliability through synchronization.

A High voltage DC (HVDC) transmission scheme is a power transmission scheme in which alternating current (AC) power of a high voltage generated in a power plant is converted into direct current (DC) power and transmitted, and then the DC power is converted again into AC power in a power reception area. In a HVDC transmission system, data collected from a plurality of yards or fields is transmitted to a plurality of control modules in which controls are performed according to the received data.

However, in a typical HVDC transmission system, there are cases where the collected data is transmitted to each control module at different times. Accordingly, since controls are performed according to the received data at different times in each control module, errors or malfunctions may occur.

Synchronization is very important for a valve control in the HVDC transmission system, and when the valve control is performed in a state where synchronization is not performed, a considerable power loss may be led.

SUMMARY

Embodiments provide a data control system capable of transmitting synchronization signal information at the time of data transmission to enable an error or malfunction due to asynchronization to be prevented.

In one embodiment, a data control system includes: a transmission module configured to add synchronization signal information to data included in a first data stream to generate a second data stream; and a plurality of control modules configured to receive the second data stream from the transmission module, wherein the data includes power information.

The details of one or more embodiments are set forth in the accompanying drawings and the description below. Other features will be apparent from the description and drawings, and from the claims.

BRIEF DESCRIPTION OF THE DRAWINGS

FIG. 6 is a block diagram illustrating in detail the control unit of FIG. 5 according to an embodiment of the present disclosure.

FIG. 7 illustrates a data packet structure for data transmission according to an embodiment of the present disclosure.

FIG. 8 illustrates a data stream structure received by the control unit of FIG. 5 according to an embodiment of the present disclosure.

DETAILED DESCRIPTION

Reference will now be made in detail to the embodiments of the present disclosure, examples of which are illustrated in the accompanying drawings. In the following description, usage of suffixes such as 'module', 'part' or 'unit' used for referring to elements is given merely to facilitate explanation of the present disclosure, without including any significant meaning by itself.

Figure 1:
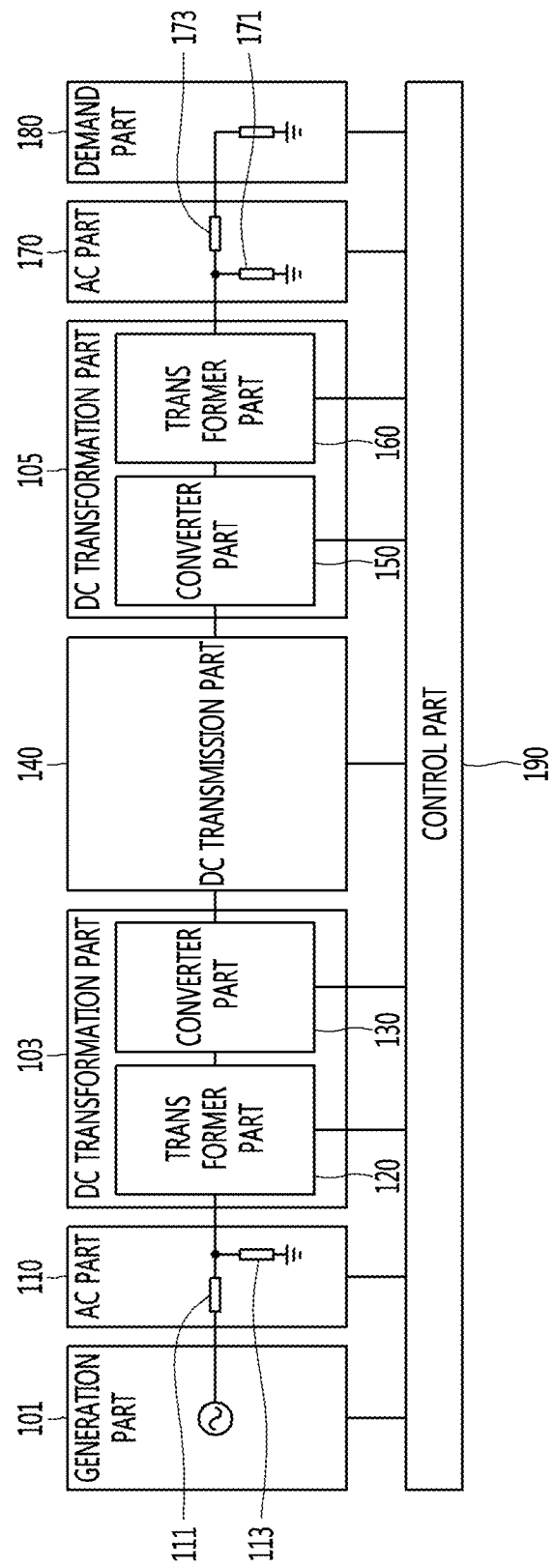
FIG. 1 illustrates a High Voltage DC (HVDC) transmission system according to an embodiment of the present disclosure.

FIG. 1 illustrated a High Voltage DC (HVDC) transmission system according to an embodiment.

As illustrated in FIG. 1, an HVDC system 100 according to an embodiment includes a generation part 101, a transmission side AC part 110, a transmission side DC transformation part 103, a DC transmission part 140, a demand side DC transformation part 105, a demand side AC part 170, a demand part 180, and a control part 190. The transmission side DC transformation part 103 includes a transmission side transformer part 120 and a transmission side converter part 130. The demand side DC transformation part 105 includes a demand side converter part 150 and a demand side transformer part 160.

The generation part 101 generates 3-phase AC power. The generation part 101 may include a plurality of power plants.

The transmission side AC part 110 delivers 3-phase AC power generated by the generation part 101 to the transmission side DC transformation part 103 including the transmission side transformer part 120 and the transmission side converter part 130. The transmission side DC transformation part 103 may include a DC substation.

The transmission side transformer part 120 isolates the transmission side AC part 110 from the transmission side converter part 130 and the DC transmission part 140.

The transmission side converter part 130 converts, into DC power, 3-phase AC power corresponding to an output of the transmission side transformer part 120.

The DC transmission part 140 delivers the transmission side DC power to the demand side.

The demand side converter part 150 converts the DC power delivered by the DC transmission part 140 into 3-phase AC power.

The demand side transformer part 160 isolates the demand side AC part 170 from the demand side converter part 150 and the DC transmission part 140.

The demand side AC part 170 provides, to the demand part 180, 3-phase AC power corresponding to an output of the demand side transformer part 160.

The control part 190 controls at least one of the generation part 101, transmission side AC part 110, transmission side DC transformation part 103, DC transmission part 140, demand side DC transformation part 105, demand side AC part 170, demand part 180, control part 190, transmission side converter part 130, and demand side converter part 150. In particular, the control part 190 may control turn-on and turn-off timings of a plurality of valves in the transmission side converter part 130 and the demand side converter part 150. At this point, the valve may correspond to a thyristor or an insulated gate bipolar transistor (IGBT).

Figure 2:
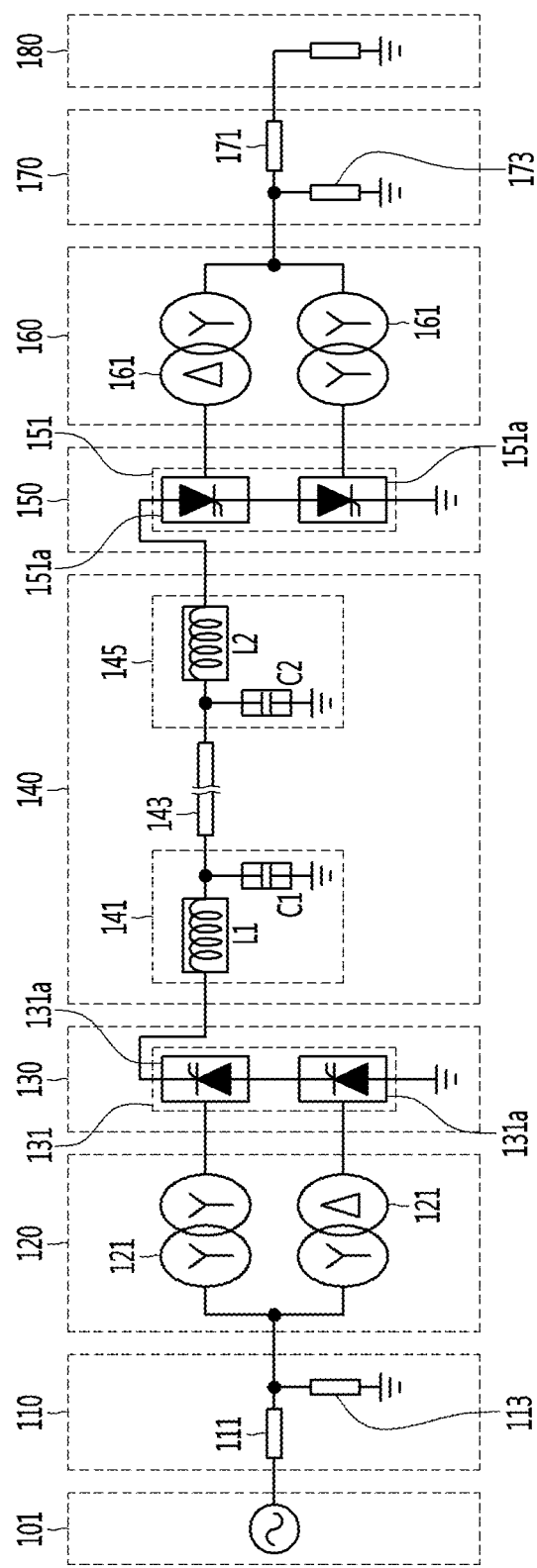
FIG. 2 illustrates a monopolar type HVDC transmission system according to an embodiment of the present disclosure.

FIG. 2 illustrated a high voltage DC transmission system in a monopolar type according to an embodiment.

In particular, FIG. 2 illustrates a system for transmitting monopole DC power. Hereinafter the monopole is assumed to be, but is not limited to, a positive pole.

The transmission side AC part 110 includes an AC transmission line 111 and an AC filter 113.

The AC transmission line 111 delivers 3-phase AC power generated by the generation part 101 to the transmission side transformer part 120.

The AC filter 113 removes frequency components other than a frequency component used by the DC transformation part 103 from the delivered 3-phase AC power.

The transmission side transformer part 120 includes one or more transformers for the positive pole. For the positive pole, the transmission side converter part 130 includes an AC-to-positive pole DC converter 131 for generating positive pole DC power, and the AC-to-positive pole DC converter 131 includes one or more 3-phase valve bridges 131a respectively corresponding to one or more transformers 121.

When one 3-phase valve bridge 131a is used, the AC-to-positive pole DC converter 131 may generate the positive pole DC power including 6 pulses by using AC power. At this point, a primary coil and a secondary coil of the one transformer 121 may have a Y-Y type connection or a Y-Δ type connection.

When two 3-phase valve bridges 131a are used, the AC-to-positive pole DC converter 131 may generate the positive pole DC power including 12 pulses by using AC power. At this point, a primary coil and a secondary coil of one of the two transformers 121 may have a Y-Y type connection and a primary coil and a secondary coil of the other transformer 121 may have a Y-Δ type connection.

When three 3-phase valve bridges 131a are used, the AC-to-positive pole DC converter 131 may generate the positive pole DC power including 18 pulses by using AC power. As the number of pulses of the positive pole DC power becomes larger, a price of the filter may become lowered.

The DC transmission part 140 includes a transmission side positive pole DC filter 141, a positive pole DC transmission line 143, and a demand side positive pole DC filter 145.

The transmission side positive pole DC filter 141 includes an inductor L1 and a capacitor C1, and DC-filters the positive pole DC power output from the AC-to-positive pole DC converter 131.

The positive pole DC transmission line 143 has one DC line for transmitting positive pole DC power and may use the ground as a feedback path of a current. One or more switches may be disposed on the DC line.

The demand side positive pole DC filter 145 includes an inductor L2 and a capacitor C2, and direct-filters positive pole power delivered through the positive pole DC transmission line 143.

The demand side converter part 150 includes a positive pole DC-to-AC converter 151 and the positive pole DC-to-AC converter 151 includes one or more 3-phase valve bridges 151a.

The demand side transformer part 160 includes, for the positive pole, one or more transformers 161 respectively corresponding to the one or more 3-phase valve bridges 151a.

When one 3-phase valve bridge 151a is used, the positive pole DC-to-AC converter 151 may generate AC power including 6 pulses by using positive pole DC power. At this point, a primary coil and a secondary coil of the one transformer 161 may have a Y-Y type connection or a Y-Δ type connection.

When two 3-phase valve bridges 151a are used, the positive pole DC-to-AC converter 151 may generate AC power including 12 pulses by using the positive pole DC power. At this point, a primary coil and a secondary coil of one of the two transformers 161 may have a Y-Y type connection and a primary coil and a secondary coil of the other transformer 161 may have a Y-Δ type connection.

When three 3-phase valve bridges 151a are used, the positive pole DC-to-AC converter 151 may generate AC power including 18 pulses by using the positive pole DC power. As the number of pulses of the AC power becomes larger, a price of the filter may become lowered.

The demand side AC part 170 includes an AC filter 171 and an AC transmission line 173.

The AC filter 171 removes remaining frequency components other than a frequency component (e.g. 60 Hz) used by the demand part 180 from the AC power generated by the demand side transformer part 160.

The AC transmission line 173 delivers the filtered AC power to the demand part 180.

Figure 3:
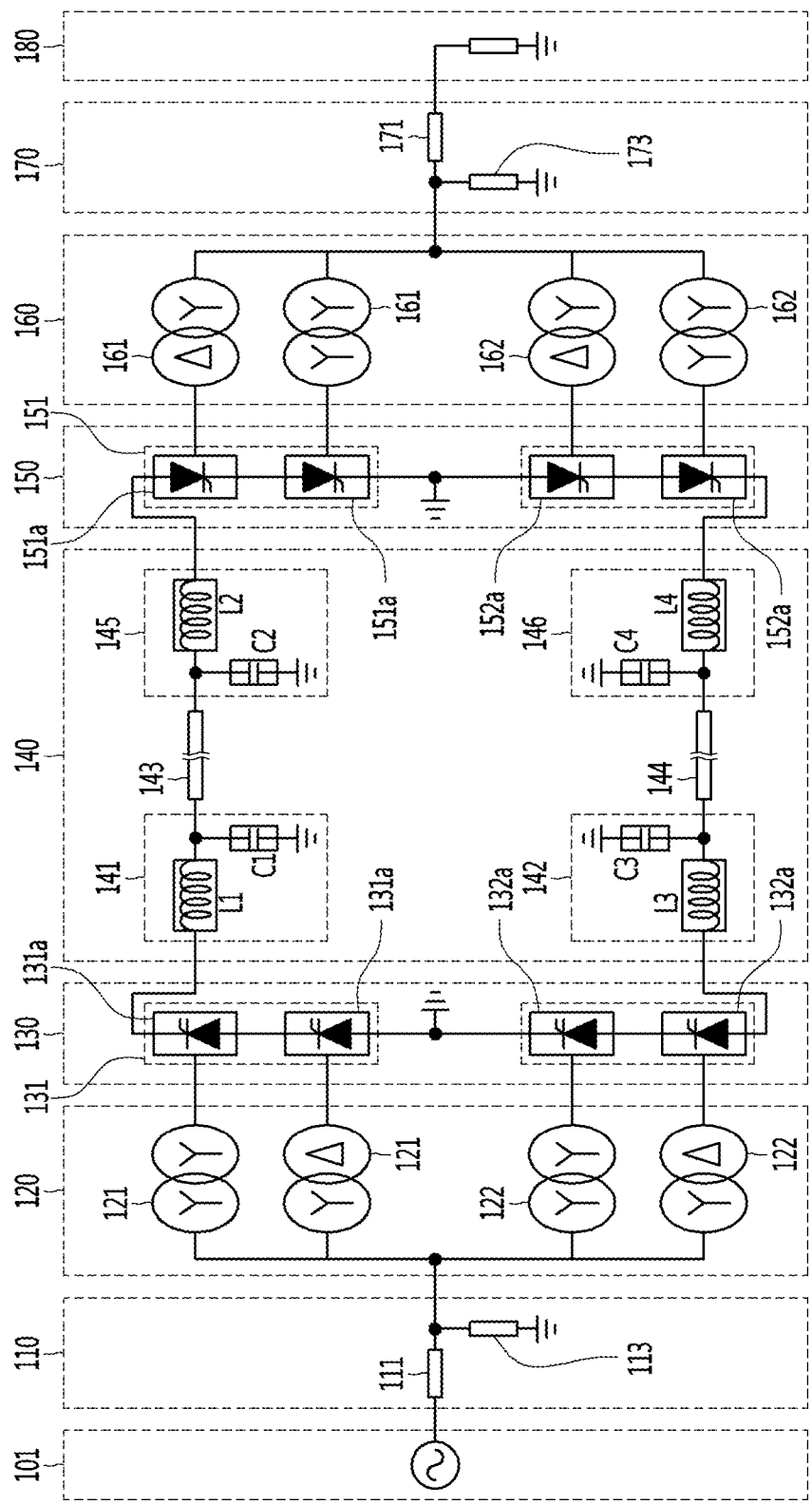
FIG. 3 illustrates a bipolar type HVDC transmission system according to an embodiment of the present disclosure.

FIG. 3 illustrated a bipolar type HVDC transmission system according to an embodiment.

In particular, FIG. 3 illustrates a system for transmitting DC power including two poles. Hereinafter the two poles are assumed to be, but not limited to, a positive pole and a negative pole.

The transmission side AC part 110 includes an AC transmission line 111 and an AC filter 113.

The AC transmission line 111 delivers 3-phase AC power generated by the generation part 101 to the transmission side transformer part 120.

The AC filter 113 removes frequency components other than a frequency component used by the AC transformation part 103 from the delivered 3-phase AC power.

The transmission side transformer part 120 includes one or more transformers 121 for the positive pole and one or more transformers 122 for the negative pole. The transmission side converter part 130 includes an AC-to-positive pole DC converter 131 for generating the positive pole DC power and an AC-to-negative pole DC converter 132 for generating negative DC power, the AC-to-positive pole DC converter 131 includes one or more 3-phase valve bridges 131a respectively corresponding to one or more transformers 121 for the positive pole, and the AC-to-negative pole DC converter 132 includes one or more 3-phase valve bridges 132a respectively corresponding to one or more transformers 122 for the negative pole.

When one 3-phase valve bridge 131a is used for the positive pole, the AC-to-positive pole DC converter 131 may generate the positive pole DC power including 6 pulses by using AC power. At this point, a primary coil and a secondary coil of the one transformer 121 may have a Y-Y type connection or a Y-Δ type connection.

When two 3-phase valve bridges 131a are used for the positive pole, the AC-to-positive pole DC converter 131 may generate the positive pole DC power including 12 pulses by using AC power. At this point, a primary coil and a secondary coil of one of the two transformers 121 may have a Y-Y type connection and a primary coil and a secondary coil of the other transformer 121 may have a Y-Δ type connection.

When three 3-phase valve bridges 131a are used for the positive pole, the AC-to-positive pole DC converter 131 may generate the positive pole DC power including 18 pulses by using AC power. As the number of pulses of the positive pole DC power becomes larger, a price of the filter may become lowered.

When one 3-phase valve bridge 132a is used for the negative pole, the AC-to-negative pole DC converter 132 may generate the negative pole DC power including 6 pulses. At this point, a primary coil and a secondary coil of the one transformer 122 may have a Y-Y type connection or a Y-Δ type connection.

When two 3-phase valve bridges 132a are used for the negative pole, the AC-to-negative pole DC converter 132 may generate the negative pole DC power including 12 pulses. At this point, a primary coil and a secondary coil of one of the two transformers 122 may have a Y-Y type connection and a primary coil and a secondary coil of the other transformer 122 may have a Y-Δ type connection.

When three 3-phase valve bridges 132a are used for the negative pole, the AC-to-negative pole DC converter 132 may generate the negative pole DC power including 18 pulses. As the number of pulses of the negative pole DC power becomes larger, a price of the filter may become lowered.

The DC transmission part 140 includes a transmission side positive pole DC filter 141, a transmission side negative pole DC filter 142, a positive pole DC transmission line 143, a negative pole DC transmission line 144, a demand side positive pole DC filter 145, and a demand side negative pole DC filter 146.

The transmission side positive pole DC filter 141 includes an inductor L1 and a capacitor C1, and DC-filters the positive pole power output from the AC-to-positive pole DC converter 131.

The transmission side negative pole DC filter 142 includes an inductor L3 and a capacitor C3, and DC-filters the negative pole power output from the AC-to-negative pole DC converter 132.

The positive pole DC transmission line 143 has one DC line for transmitting the positive pole DC power and may use the ground as a feedback path of a current. One or more switches may be disposed on the DC line.

The negative pole DC transmission line 144 has one DC line for transmitting the negative pole DC power and may use the ground as a feedback path of a current. One or more switches may be disposed on the DC line.

The demand side positive pole DC filter 145 includes an inductor L2 and a capacitor C2, and DC-filters the positive pole power delivered through the positive pole DC transmission line 143.

The demand side negative pole DC filter 146 includes an inductor L4 and a capacitor C4, and DC-filters the negative pole power delivered through the negative pole DC transmission line 144.

The demand side converter part 150 includes a positive pole DC-to-AC converter 151 and a negative pole DC-to-AC converter 152, and the positive pole DC-to-AC converter 151 includes one or more 3-phase valve bridges 151a, and the negative pole DC-to-AC converter 152 includes one or more 3-phase valve bridges 152a.

The demand side transformer part 160 includes, for the positive pole, one or more transformers 161 respectively corresponding to one or more 3-phase valve bridges 151a, and one or more transformers 162, for the negative pole, respectively corresponding to one or more 3-phase valve bridges 152a.

When one 3-phase valve bridge 151a is used for the positive pole, the positive pole DC-to-AC converter 151 may generate AC power including 6 pulses by using the positive pole DC power. At this point, a primary coil and a secondary coil of the one transformer 161 may have a Y-Y type connection or a Y-Δ type connection.

When two 3-phase valve bridges 151a are used for the positive pole, the positive pole DC-to-AC converter 151 may generate AC power including 12 pulses by using the positive pole DC power. At this point, a primary coil and a secondary coil of one of the two transformers 161 may have a Y-Y type connection and a primary coil and a secondary coil of the other transformer 161 may have a Y-Δ type connection.

When three 3-phase valve bridges 151a are used for the positive pole, the positive pole DC-to-AC converter 151 may generate AC power including 18 pulses by using the positive pole DC power. As the number of pulses of the AC power becomes larger, a price of the filter may become lowered.

When one 3-phase valve bridge 152a is used for the negative pole, the negative pole DC-to-AC converter 152 may generate AC power including 6 pulses by using the negative pole DC power. At this point, a primary coil and a secondary coil of the one transformer 162 may have a Y-Y type connection or a Y-Δ type connection.

When two 3-phase valve bridges 152a are used for the negative pole, the negative pole DC-to-AC converter 152 may generate AC power including 12 pulses by using the negative pole DC power. At this point, a primary coil and a secondary coil of one of the two transformers 162 may have a Y-Y type connection and a primary coil and a secondary coil of the other transformer 162 may have a Y-Δ type connection.

When three 3-phase valve bridges 152a are used for the negative pole, the negative pole DC-to-AC converter 152 may generate AC power including 18 pulses by using the negative pole DC power. As the number of pulses of the AC power becomes larger, a price of the filter may become lowered.

The demand side AC part 170 includes an AC filter 171 and an AC transmission line 173.

The AC filter 171 removes remaining frequency components other than a frequency component (e.g. 60 Hz) used by the demand part 180 from the AC power generated by the demand side transformer part 160.

The AC transmission line 173 delivers the filtered AC power to the demand part 180.

Figure 4:
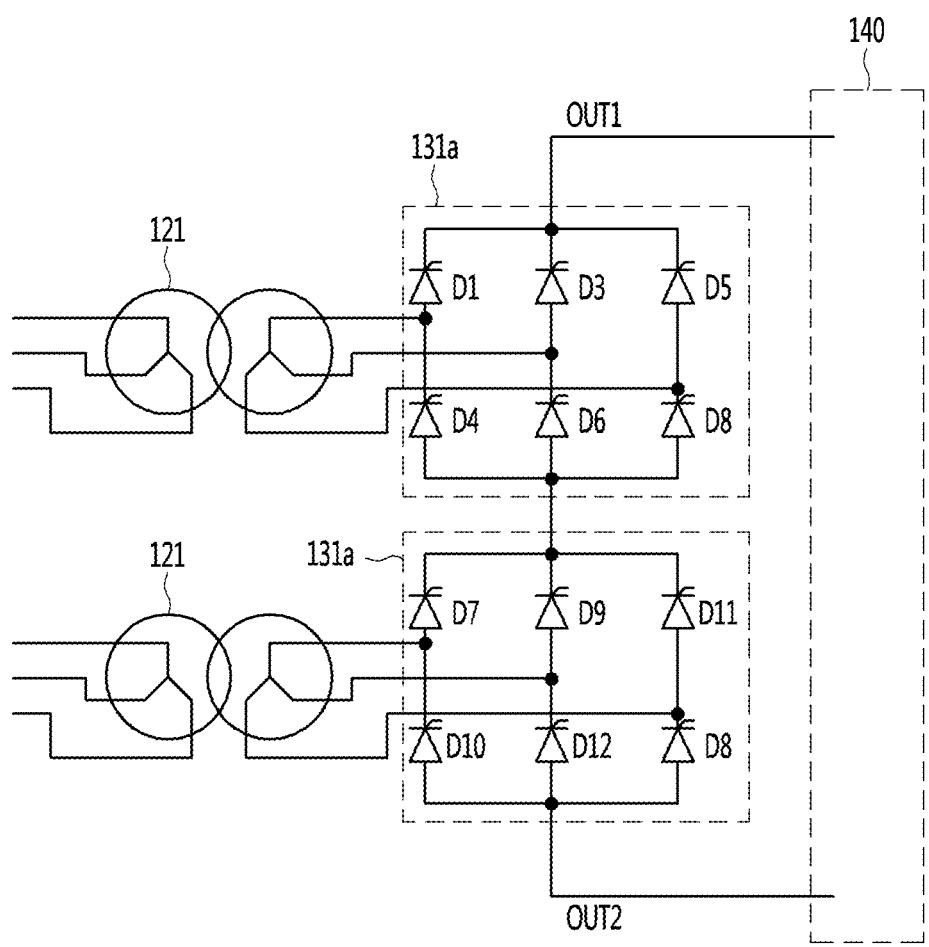
FIG. 4 illustrates a connection between a transformer and a 3-phase valve bridge according to an embodiment of the present disclosure.

FIG. 4 illustrates a connection between a transformer and a three-phase valve bridge according to an embodiment.

In particular, FIG. 4 shows connections between two transformers 121 for positive pole and two 3-phase valve bridges 131a for positive pole. Connections between two transformers 122 for negative pole and two 3-phase valve bridges 132a for negative pole, connections between two transformers 161 of positive pole and two 3-phase valve bridges 151a for positive pole, connections between two transformers 162 of negative pole and two 3-phase valve bridges 152a for negative pole, a connection between one transformer 121 of positive pole and one 3-phase valve bridge 131a for positive pole, and a connection between one transformer 161 of positive pole and one 3-phase valve bridge 151a for positive pole may be easily derived from the embodiment of FIG. 4, and accordingly drawings and descriptions thereof will be omitted.

In FIG. 4, the transformer 121 including a Y-Y type connection is called as an upper transformer, the transformer 121 including a Y-Δ type connection is called as a lower transformer, the 3-phase valve bridge 131a connected to the upper transformer is called as an upper 3-phase valve bridge, and the 3-phase valve bridge 131a connected to the lower transformer is called as a lower 3-phase valve bridge.

The upper 3-phase valve bridge and the lower 3-phase valve bridge have a first output terminal OUT1 and a second output terminal OUT2 which are two output terminals through which DC power is output.

The upper 3-phase valve bridge includes 6 valves D1 to D6, and the lower 3-phase bridge includes 6 valves D7 to D12.

The valve D1 includes a cathode connected to the first output terminal OUT1 and an anode connected to a first terminal of a secondary coil of the upper transformer.

The valve D2 includes a cathode connected to an anode of the valve D5 and an anode connected to an anode of the valve D6.

The valve D3 includes a cathode connected to the first output terminal OUT1 and an anode connected to a second terminal of the secondary coil of the upper transformer.

The valve D4 includes a cathode connected to the anode of the valve D1 and an anode connected to an anode of the valve D6.

The valve D5 includes a cathode connected to the first output terminal OUT1 and an anode connected to a third terminal of the secondary coil of the upper transformer.

The valve D6 includes a cathode connected to the anode of the valve D3.

The valve D7 includes a cathode connected to the anode of the valve D6 and an anode connected to the first terminal of the secondary coil of the lower transformer.

The valve D8 includes a cathode connected to an anode of the valve D11 and an anode connected to the second output terminal OUT2.

The valve D9 includes a cathode connected to the anode of the valve D6 and an anode connected to the second terminal of the secondary coil of the lower transformer.

The valve D10 includes a cathode connected to the anode of the valve D7 and an anode connected to the second output terminal OUT2.

The valve D11 includes a cathode connected to the anode of the valve D6 and the anode connected to the third terminal of the secondary coil of the lower transformer.

The valve D12 includes a cathode connected to the anode of the valve D7 and an anode connected to the second output terminal OUT2.

Figure 5:
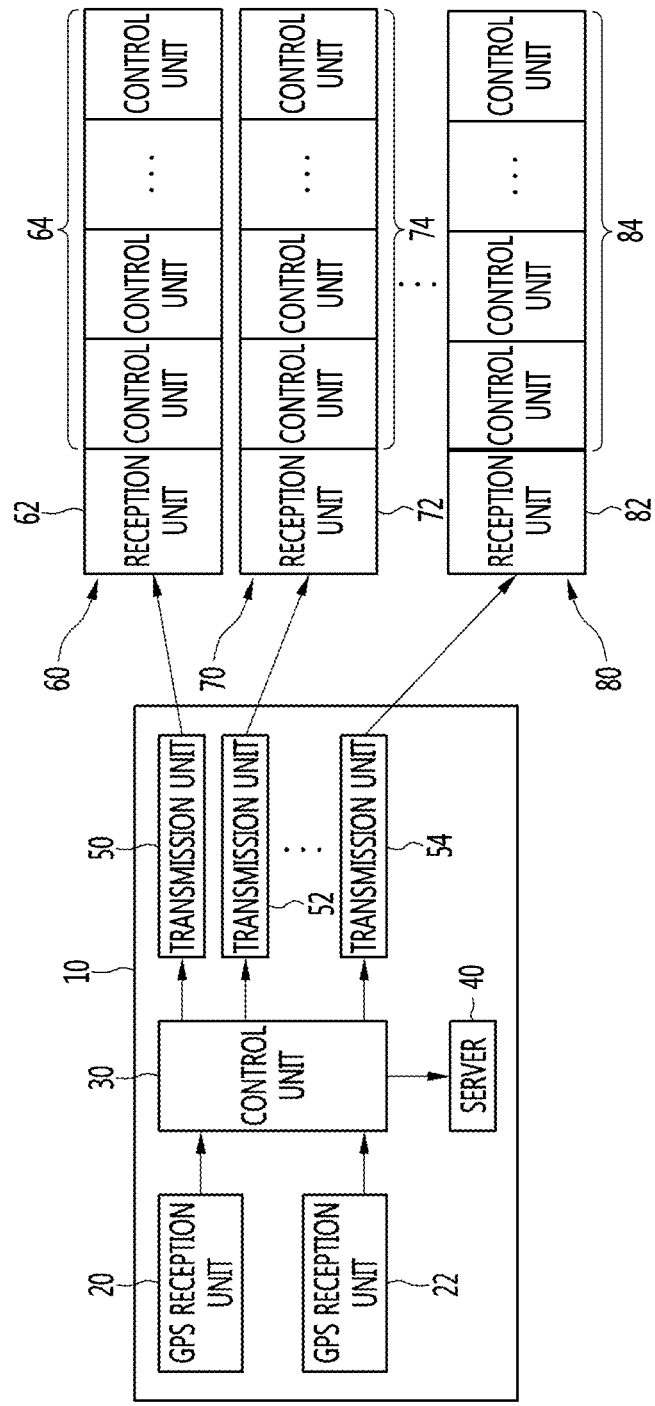
FIG. 5 is a block diagram illustrating a data control system according to an embodiment of the present disclosure.

FIG. 5 is a block diagram illustrating a data control system according to an embodiment.

Referring to FIG. 5, a data control system according to an embodiment includes a transmission module 10 and a plurality of control modules 60, 70, and 80.

The transmission module 10 wirelessly receives data from yards or fields through wireless communication, and transmits the received data to the plurality of control modules 60, 70, and 80.

The data relates to power information which includes, for example, but is not limited to, a voltage value, a current value, whether an error occurs in a sensor installed in the yard or field, or state information for the yard or field.

Each of the control modules 60, 70, and 80 properly controls and processes the data transmitted from the transmission module 10.

The control modules 60, 70, and 80 may respectively include reception units 62, 72, and 82 and a plurality of control units 64, 74, and 84. For example, a first control module 60 may include a reception unit 62 and a plurality of control unit 64. A data stream transmitted from the transmission module 10 and received by the reception unit 62 is provided to the plurality of control unit 64 and each of the plurality of control unit 64 may perform a control according to data included in the data stream. The plurality of control unit 64 may perform an identical control or different controls from each other.

The transmission module 10 includes one or more global positioning system (GPS) reception units 20 and 22, a control unit 30, a server 40, and a plurality of transmission units 50, 52, and 54.

The GPS reception units 20 and 22 wirelessly receive data from yards or fields to transmit the received data to the control unit 30.

The GPS reception units 20 and 22 and the control unit 30 may be connected to each other through an optical cable, but the embodiment is not limited thereto.

Each of the reception units 20 and 22 is responsible for several yards or fields, and data collected from several yards or fields may be wirelessly transmitted to the GPS reception units 20 and 22. Accordingly, in order to cover lots of yards and fields, the GPS reception units 20 and 22 may be provided by at least one or more.

The control unit 30 may process data transmitted from the GPS reception units 20 and 22.

In detail, the control unit 30 may generate data to be transmitted to the plurality of control modules 60, 70, and 80 based on the data transmitted from the GPS reception units 20 and 22. In addition, the control unit 30 may include synchronization signal information into the data to be transmitted to the plurality of control modules 60, 70, and 80. The synchronization signal information may include a corresponding data identification signal and time information.

For example, the control unit 30 may receive a data stream from the GPS reception units 20 and 22 as illustrated in FIG. 8.

As illustrated in FIG. 8, the data stream may include a control packet duration C and a data packet duration D.

Accordingly, data transmitted from the yards or fields may be included in the data packet duration D of the data stream and transmitted to the control unit 30 through the GPS reception units 20 and 22.

The control unit 30 may extract corresponding data Data n from the data stream transmitted through the GPS reception units 20 and 22 and generate a data stream including the synchronization signal information together with the extracted data. In other words, as illustrated in FIG. 9, the data Data n extracted from the data stream is included in the data packet duration D1 and the synchronization signal information may be included in a dummy packet duration Dummy D1.

Figure 9:
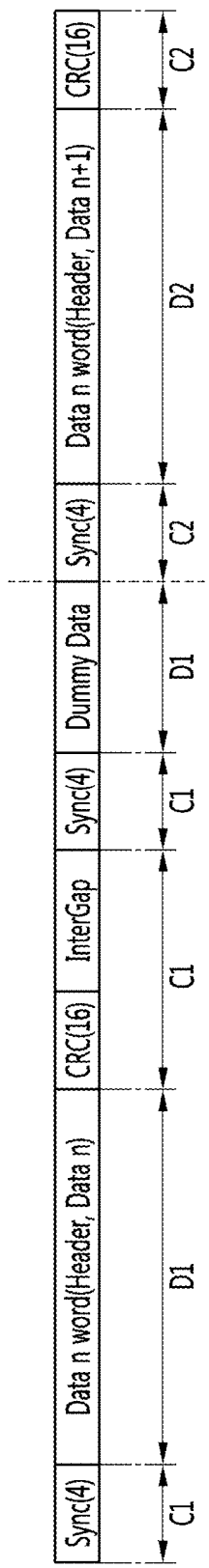
FIG. 9 illustrates a data stream structure transmitted from the control unit of FIG. 5 according to an embodiment of the present disclosure.

As illustrated in FIG. 9, another data may be included in the data packet period D2 of the data stream.

The corresponding data Data n and the synchronization signal information may have a data packet structure illustrated in FIG. 7.

In other words, the data packet structure may include a message type field Message type, a transmission length information field Transmit length, a time information field Time slot ID, a data identification information field Sequence No., and a data field Data [0] to Data [28].

Here, the time information field Time Slot ID and the data identification number field Sequence No. may configure the synchronization signal information.

In the end, the control unit 30 may transmit the data stream illustrated in FIG. 9 to each control module 60, 70, or 80 based on the data packet structure as illustrated in FIG. 7.

The data stream (see FIG. 9), which includes the synchronization signal information together with the extracted data, may be generated in correspondence to each control module 60, 70, or 80, which will receive the corresponding data stream, and may be transmitted to the corresponding control modules 60, 70, and 80 through the transmission units 50, 52, and 54 to which the generated data stream correspond.

As another example, a data stream, which includes the synchronization signal information together with the extracted data, is simultaneously transmitted to the plurality of transmission units 50, 52, and 54, and the transmission units 50, 52, and 54 may respectively transmit the corresponding data stream to the corresponding control modules 60, 70, and 80. In this case, the data stream including the synchronization signal information together with the extracted data is generated only once and simultaneously transmitted to the plurality of transmission units 50, 52, and 54.

The plurality of transmission units 50, 52, and 54 may be transmit the data stream provided from the control unit 30 to the corresponding control modules 60, 70, and 80. The data stream provided from the control unit 30 may include data information and the synchronization signal information.

The transmission units 50, 52, and 54 and the reception units 62, 72, and 82 of the control modules 60, 70, and 80 may be respectively connected through optical cables, but the embodiment is not limited thereto.

The control modules 60, 70, and 80 may respectively include reception units 62, 72, and 82 for receiving the data stream transmitted from the corresponding transmission units 50, 52, and 54 in the transmission module 10 and a plurality of control units 64, 74, and 84 for performing controls proper to corresponding data based on the synchronization signal information included in the data stream received from the reception units 62, 72, and 82.

Since each of the control units 64, 74, and 84 performs a control on corresponding data at an identical time based on the synchronization signal information included in the data stream, an error or malfunction, which is caused by asynchronization between the control modules 60, 70, and 80, may be prevented.

On the other hand, a server 40 of the transmission module 10 communicates with the control unit 30, information in the control unit 30 may be transmitted to the server 40 and stored, or a command from the server 40 may be delivered to the control unit 30 and performed by the control unit 30.

With reference to FIG. 6, the control unit 30 according to the embodiment will be described in detail.

FIG. 6 is a block diagram illustrating in detail the control unit of FIG. 5.

Referring to FIG. 6, the control unit 30 may include a data control unit 32, an optical communication transmission/reception unit 34, and a packet generation unit 36.

The data control unit 32 is responsible for an overall control of the control unit 30. In particular, the data control unit 32 may control to extract data from the data stream transmitted from the GPS reception units 20 and 22 to the optical communication transmission/reception unit 34 and then delivered to the packet generation unit 36, and to generate, in addition to the extracted data, a new data stream to which the synchronization signal information is added.

The data control unit 32 performs communication with the server 40 to transmit the corresponding synchronization signal information to the server 40, or receive the corresponding synchronization signal information from the server 40 under a control of the server 40 to include the received synchronization signal information in a corresponding data stream, but the embodiment is not limited thereto.

The optical communication transmission/reception unit 34 may include a reception stage connected to the GPS reception units 20 and 22 through a first optical communication cable and a plurality of transmission stages connected to the plurality of transmission units 50, 52, and 54 through a second optical communication cable.

The data stream, which includes specific data transmitted from the GPS reception units 20 and 22, may be input to the reception stage of the optical communication transmission/reception unit 34 through the first optical communication cable. The data steam (hereinafter, a first data stream) input to the reception stage may be delivered to the packet generation unit 36.

The packet generation unit 36 may extract corresponding specific data from the data stream under the control of the data control unit 32 and generate a new data stream (hereinafter a second data stream) in which the synchronization signal information provided from the data control unit 32 is added to the extracted data.

The packet generation unit 36 may generate the second data stream, which includes the synchronization signal as illustrated in FIG. 9, based on the first data stream as illustrated in FIG. 8.

The packet generation unit 36 may deliver the second data stream to the optical communication transmission/reception unit 34.

The plurality of reception stages of the optical communication transmission/reception unit 34 may simultaneously deliver the second data stream, which has been delivered from the packet generation unit 36, to the plurality of corresponding transmission units 50, 52, and 54 through the second optical communication cable.

In addition, the second data stream may be simultaneously transmitted to the reception units 62, 72, and 82 of the corresponding control modules 60, 70, and 80 through the plurality of transmission units 50, 52, and 54. Each of the control modules 60, 70, and 80 may extract the synchronization signal information included in the second data stream and simultaneously perform a control according to the corresponding data based on the synchronization signal information.

According to embodiments, since the synchronization signal information is transmitted together with the corresponding data before transmission to each of the control modules 60, 70, and 80, and each of the control modules 60, 70, and 80 may simultaneously perform a control according to the corresponding data at a synchronized time based on the synchronization signal information, an error or malfunction, which is caused by asynchronization between each control module 60, 70, and 80, may be prevented.

In addition, according to embodiments, since controls according to corresponding data are simultaneously performed based on the synchronization signal information, a data loss due to asynchronization may be prevented to improve reliability.

According to an embodiment, the above-described method may be implemented as a processor-readable code on a medium with a program recorded thereon. Examples of the computer readable recording medium include read-only memory (ROM), random-access memory (RAM), CD-ROMs, solid-state memory, magnetic tapes, floppy disks, and optical data storage devices.

As can be seen from the foregoing, the above-described embodiments is not limited to the configurations and methods of the embodiments described above, but the entirety of or a part of the embodiments may be configured to be selectively combined such that various modifications of the embodiments can be implemented.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data control system, comprising:
 a transmission system configured to add synchronization signal information to data included in a first data stream to generate a second data stream and to transmit the generated second data stream to a plurality of control systems; and
 the plurality of control systems configured to receive the second data stream from the transmission system,
 wherein the data comprises power information,
 wherein the transmission system comprises:
  at least one global positioning system (GPS) reception unit configured to receive the first data stream;
  a first control unit connected to the at least one GPS reception unit and configured to extract the data from the received first data stream and generate the second data stream comprising the extracted data and the synchronization signal information; and
  a plurality of transmission units connected to the first control unit and configured to transmit the second data stream to the plurality of control systems, and
 wherein each of the plurality of control systems comprises:
  a reception unit; and
  a plurality of control units configured to simultaneously perform controls on the data at an identical time based on the synchronization signal information included in the received second data stream.

2. The data control system according to claim 1, wherein the first data stream is collected from a yard or a field to be transmitted.

3. The data control system according to claim 1, wherein the second data stream is separately generated and transmitted to the plurality of control systems.

4. The data control system according to claim 1, wherein the second data stream is generated once and simultaneously transmitted to the plurality of control systems.

5. The data control system according to claim 1, wherein the transmission system further comprises a server configured to receive the synchronization signal information or transmit the synchronization signal information to the first control unit.

6. The data control system according to claim 1, wherein the first control unit comprises:
 a packet generation unit configured to generate the second data stream based on the first data stream; and
 an optical communication transmission/reception unit configured to receive the first data stream and a plurality of transmission stages configured to transmit the second data stream generated from the packet generation unit to the plurality of transmission units.

7. The data control system according to claim 6, wherein the optical communication transmission/reception unit is connected to the GPS reception unit through a first optical communication cable, and
 the transmission stages are connected to the plurality of transmission units through corresponding second optical communication cables.

8. The data control system according to claim 1, wherein the plurality of transmission units of the transmission system and the plurality of reception units are connected through optical communication cables so as to correspond to each other.

9. The data control system according to claim 1, wherein the synchronization signal information is included in a dummy data duration of the second data stream.

10. The data control system according to claim 9, wherein the dummy data duration comprises time information as the synchronization signal information and data identification information.

11. The data control system according to claim 1, wherein the first data stream is wirelessly received.

12. The data control system according to claim 1, wherein the power information comprises at least one of a voltage value or a current value, whether an error occurs in a sensor installed in a yard or field, and state information for the yard or field.

* * * * *